(12) United States Patent
Su

(10) Patent No.: US 12,140,609 B2
(45) Date of Patent: Nov. 12, 2024

(54) UNIVERSAL TEST INTERFACE SYSTEMS AND METHODS

(71) Applicant: Advantest Corporation, Tokyo (JP)

(72) Inventor: Mei-Mei Su, Mountain View, CA (US)

(73) Assignee: Advantest Corporation, Tokyo (JP)

( * ) Notice: Subject to any disclaimer, the term of this patent is extended or adjusted under 35 U.S.C. 154(b) by 87 days.

(21) Appl. No.: 17/219,400

(22) Filed: Mar. 31, 2021

(65) Prior Publication Data

US 2021/0302469 A1 Sep. 30, 2021

Related U.S. Application Data

(60) Provisional application No. 63/002,699, filed on Mar. 31, 2020.

(51) Int. Cl.
*G01R 1/04* (2006.01)

(52) U.S. Cl.
CPC .................. *G01R 1/0416* (2013.01)

(58) Field of Classification Search
CPC ............ G01R 1/02; G01R 1/04–0491; G01R 31/2801; G01R 31/2803; G01R 31/2806; G01R 31/2808; G01R 31/2818; G01R 31/3181; G01R 31/319
See application file for complete search history.

(56) References Cited

U.S. PATENT DOCUMENTS

| | | | |
|---|---|---|---|
| 5,751,151 A | 5/1998 | Levy et al. | |
| 6,070,478 A | 6/2000 | Krajec et al. | |
| 6,552,528 B2 | 4/2003 | Frame | |
| 6,696,848 B2 | 2/2004 | Robinson | |
| 6,862,705 B1 | 3/2005 | Nesbitt et al. | |
| 8,836,363 B2 | 9/2014 | Goel et al. | |
| 9,251,915 B2 * | 2/2016 | Lai | G11C 29/08 |
| 10,241,146 B2 | 3/2019 | Su et al. | |
| 11,099,228 B2 | 8/2021 | Su | |
| 11,320,480 B1 | 5/2022 | Gaoiran | |
| 11,334,459 B2 | 5/2022 | Bautista | |

(Continued)

FOREIGN PATENT DOCUMENTS

| | | |
|---|---|---|
| CN | 108802519 | 11/2018 |
| CN | 110908849 | 3/2020 |

(Continued)

*Primary Examiner* — Huy Q Phan
*Assistant Examiner* — David B Frederiksen

(57) ABSTRACT

Presented embodiments facilitate efficient and effective flexible implementation of different types of testing procedures in a test system. In one embodiment, a testing system comprises: a loadboard including multiple universal interfaces with the same coupling configuration, a plurality of devices under test (DUTs) including a plurality of DUT interfaces respectively, and a plurality of universal adapters including a plurality of matching universal interfaces that match the plurality of universal interfaces in the loadboard and a plurality of matching DUT interfaces that match the plurality of DUT interfaces in the respective DUT. The plurality of universal adapters are selectively coupled to the loadboard and the plurality of universal adapters are selectively coupled to the DUTs, respectively. A first one of the plurality of DUT interfaces includes a different coupling configuration than a second one of the plurality of DUT interfaces.

20 Claims, 11 Drawing Sheets

(56) References Cited

U.S. PATENT DOCUMENTS

| | | | |
|---|---|---|---|
| 2003/0197521 A1* | 10/2003 | Weimer | G01R 1/07378 |
| | | | 324/756.07 |
| 2003/0208713 A1 | 11/2003 | Evans | |
| 2004/0205437 A1* | 10/2004 | Yao | G01R 31/31921 |
| | | | 714/742 |
| 2005/0174105 A1* | 8/2005 | Matsuura | H03F 3/3018 |
| | | | 324/754.08 |
| 2005/0253617 A1* | 11/2005 | Roberts | G01R 31/31907 |
| | | | 324/756.02 |
| 2006/0184332 A1* | 8/2006 | Ishida | G01R 31/31716 |
| | | | 702/69 |
| 2007/0096758 A1 | 5/2007 | Kolman | |
| 2007/0159197 A1* | 7/2007 | Brueckner | G01R 31/01 |
| | | | 324/754.08 |
| 2009/0240989 A1 | 9/2009 | Yokoyama | |
| 2010/0117668 A1* | 5/2010 | Redlich | G01R 31/3025 |
| | | | 324/756.07 |
| 2011/0087942 A1* | 4/2011 | Conner | G01R 31/31908 |
| | | | 714/738 |
| 2013/0326299 A1* | 12/2013 | Oshima | G01R 31/3177 |
| | | | 714/735 |
| 2014/0236525 A1* | 8/2014 | Chan | G01R 31/31919 |
| | | | 702/119 |
| 2014/0244204 A1* | 8/2014 | Frediani | G01R 31/00 |
| | | | 702/119 |
| 2014/0253099 A1 | 9/2014 | Han et al. | |
| 2015/0028908 A1* | 1/2015 | Kushnick | G06F 11/2221 |
| | | | 324/750.05 |
| 2016/0109485 A1 | 4/2016 | Haefner et al. | |
| 2017/0212164 A1* | 7/2017 | Caradonna | G01R 31/31905 |
| 2018/0224502 A1* | 8/2018 | Champoux | G01R 31/3177 |
| 2018/0259572 A1 | 9/2018 | Su | |
| 2018/0267101 A1 | 9/2018 | Champoux et al. | |
| 2018/0313889 A1* | 11/2018 | Su | G01R 31/2806 |
| 2018/0313890 A1* | 11/2018 | Wolff | G01R 31/2893 |
| 2019/0277907 A1* | 9/2019 | Wolff | G01R 31/2868 |
| 2020/0033405 A1 | 1/2020 | Chan et al. | |
| 2020/0033409 A1 | 1/2020 | Hobbs et al. | |
| 2020/0200819 A1 | 6/2020 | Malisic et al. | |
| 2021/0302469 A1 | 9/2021 | Su | |
| 2022/0058097 A1 | 2/2022 | Bautista | |
| 2022/0155342 A1 | 5/2022 | Chow | |

FOREIGN PATENT DOCUMENTS

| | | |
|---|---|---|
| CN | 114509615 | 5/2022 |
| TW | 201413267 | 4/2014 |
| TW | 201433804 A | 9/2014 |
| TW | 201706862 A | 2/2017 |
| TW | 201907174 | 2/2019 |

* cited by examiner

800

801
Coupling a plurality of DUT's to a respective plurality of universal adapters, wherein one of the plurality of DUT's is configured with a different coupling form factor than another one of the plurality of DUT's.

802
Coupling the plurality of universal adapters to a respective plurality of universal interfaces included in a test loadboard, wherein the plurality of universal interfaces have the same coupling form factor.

803
Testing the DUTs.

FIG. 8

UNIVERSAL TEST INTERFACE SYSTEMS AND METHODS

RELATED APPLICATIONS

This application claims the benefit of and priority to provisional application 63/002,699 entitled Universal Interface with Physical Adapter to Different Form Factor DUTs filed Mar. 31, 2020, which is incorporated herein by reference.

FIELD OF THE INVENTION

The present invention relates to the field of electronic testing.

BACKGROUND OF THE INVENTION

Electronic systems and devices have made a significant contribution towards the advancement of modern society and have facilitated increased productivity and reduced costs in analyzing and communicating information in a variety of business, science, education, and entertainment applications. Conventional testing systems and methods often have various limitations.

Existing tester systems that use a chamber assembly typically have the loadboard embedded in the chamber assembly and they are not designed to be removed (or removed often) from the chamber. Therefore, the chamber assembly is generally limited to testing only those devices under test (DUTs) of a single form factor that can interface with the embedded loadboard's form factor.

SUMMARY

Presented embodiments facilitate efficient and effective flexible implementation of different types of testing procedures in a test system. In one embodiment, a testing system comprises: a loadboard including multiple universal interfaces with the same coupling configuration, a plurality of devices under test (DUTs) including a plurality of DUT interfaces respectively, and a plurality of universal adapters including a plurality of matching universal interfaces that match the plurality of universal interfaces in the loadboard respectively and a plurality of matching DUT interfaces that match the plurality of DUT interfaces in the respective DUT. The plurality of universal adapters are selectively coupled to the loadboard and the plurality of universal adapters are selectively coupled to the DUTs, respectively. A first one of the plurality of DUT interfaces includes a different coupling configuration than a second one of the plurality of DUT interfaces.

In one embodiment, one of the plurality of matching universal interfaces includes multiple matching universal couplers that match respective universal couplers included in one of the plurality of universal interfaces. One of the plurality of matching DUT interfaces can include multiple matching DUT couplers that respectively match DUT couplers included in one of the plurality of DUT interfaces. A DUT coupler included in a first one of the plurality of DUT interfaces can be different than a DUT coupler included in a second one of the plurality of DUT interfaces. A connector in one of the plurality of universal interfaces can be the same type of connector as a respective connector that is in another one of the plurality of universal interfaces. In one exemplary implementation, a connector in one of the plurality of DUT interfaces is a different type of connector than a respective connector that is in another one of the plurality of DUT interfaces. One of the plurality of universal interfaces can include a co-axial connector. One of the plurality of DUT interfaces can include a serial advanced technology attachment (SATA) connector. One of the plurality of DUT interfaces can include a Non Volatile Memory Express (NVMe) connector.

In one embodiment, a universal adapter method comprises coupling a plurality of DUT's to a respective plurality of universal adapters, coupling the plurality of universal adapters to a respective plurality of universal interfaces included in a test loadboard, and testing the DUTs. One of the plurality of DUT's is configured with a different coupling form factor than another one of the plurality of DUT's. The plurality of universal interfaces have the same coupling form factor. The plurality of DUT's can be removable from the respective plurality of universal adapters, and the plurality of universal adapters can be removable from the respective plurality of universal interfaces. In one exemplary implementation, one of the plurality of DUT's is a first type of device and another one of the plurality of DUT's is a second type of device. The plurality of DUTs can be coupled to test equipment that includes the loadboard without changing out the test loadboard. A DUT interface in one of the plurality of DUTs can be different than another DUT interface in another one of the plurality DUTs.

In one embodiment, a universal adapter comprises: a matching universal interface configured to selectively couple with universal interfaces included in a loadboard, a matching device under test (DUT) interface configured to selectively couple with a plurality of DUTs, and a universal adaptor internal interface coupled to the matching universal interface and the matching device under test (DUT) interface. The universal adaptor internal interface is configured to coordinate the transition of signal communication between matching universal interface and matching DUT interface. The matching universal interface can include a matching universal coupler that matches a universal coupler included in a loadboard. The matching DUT interface can include a matching DUT coupler that matches a DUT coupler included in a loadboard. The matching DUT coupler can be different than another matching DUT coupled included in another universal adapter. The universal interface can include a co-axial connector and a serial advanced technology attachment (SATA) connector.

DESCRIPTION OF THE DRAWINGS

The accompanying drawings, which are incorporated in and form a part of this specification, are included for exemplary illustration of the principles of the present invention and not intended to limit the present invention to the particular implementations illustrated therein. The drawings are not to scale unless otherwise specifically indicated.

FIG. 8 is a flow chart of an exemplary method in accordance with one embodiment.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Presented embodiments enable efficient and effective testing of devices under test (DUTs) with a plurality of different coupling configurations over multiple devices. In one embodiment, universal adapters enable DUTs with different coupling interface configurations to couple to a load board with a universal coupling interface configurations. In one exemplary implementation, the DUTs with different coupling interface configurations can be effectively and efficiently coupled to a test system without having to change out loadboards to accommodate the respectively different coupling interface configurations of the DUTs. In one embodiment, the universal adapters can enable greater overall testing throughput than typical traditional testing systems.

Figure 1:
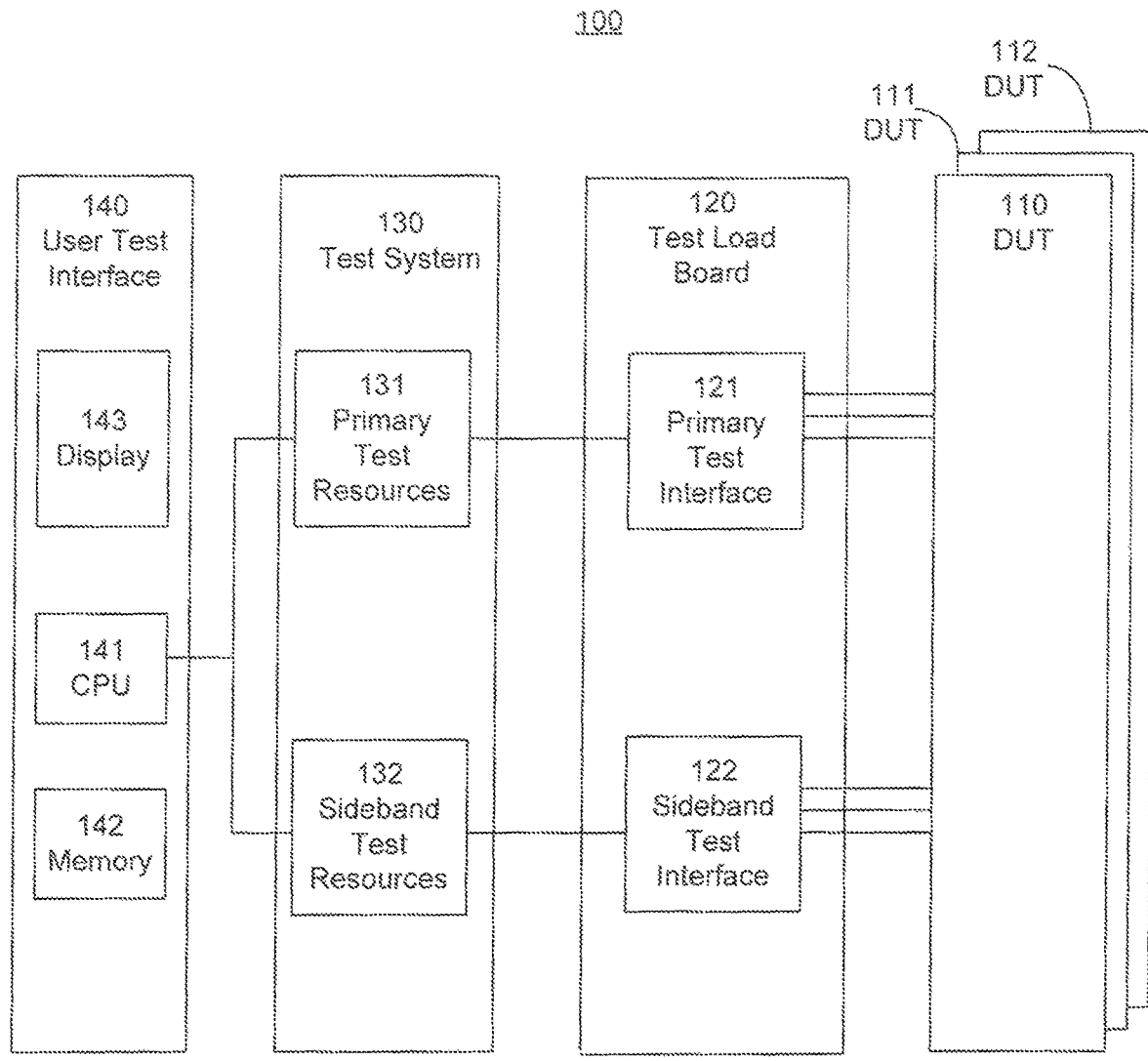
FIG. 1 is a block diagram of an exemplary test environment or system in accordance with one embodiment.

FIG. 1 is a block diagram of an exemplary test environment or system 100 in accordance with one embodiment. The test environment or system 100 includes devices under test (DUT) (e.g., 110, 111, 112, etc.), test or load board 120, test equipment 130, and user test interface 140. The DUTs (e.g., 110, 111, 112, etc.) are coupled to the test load board 120 which is coupled to test equipment 130, which in turn is coupled to the CPU 141. In one embodiment, the test load board 120 includes primary or persistent test interface 121 and sideband interface 122. Load board 120 is configured to electrically and physically couple the DUTs to the test equipment 130. Test equipment 130 direct and controls testing of the DUTs and includes resources that are assigned to the respective DUTs. In one exemplary implementation, resources are assigned to DUT 110 as primary test resources 131 and sideband resources 132. Test equipment 130 can include a Field Programmable Gate Array (FPGA). In one embodiment, test various information (e.g., test results, preliminary analysis results, reconfigured test information, testing directions, etc.) is communicated between test equipment 130 and user test interface 140. User test interface 140 includes processing unit 141, memory 142, and display 143. Memory 142 can store testing related information, processing unit 141 can process the information, and display 143 can display the information.

The presented systems and methods are directed to facilitating efficient and effective testing and debugging of different form factor DUTs. In one embodiment, a universal DUT adaptor testing system and method allows DUTs of different form factors to be used with a generic or universal loadboard. This enables the universal loadboard to be advantageously employed by a tester system to support testing of various different form factors.

In one embodiment, universal DUT adaptor testing systems and methods advantageously provide a generic loadboard that can be used with different physical adapters that allow DUTs of various different form factors to readily interface with a same loadboard without requiring removal of the loadboard, unlike prior art inflexible designs. Various different adapters can be used to mate with the different form factor DUTs. These adapters also mate with the universal socket of the loadboard thereby extending the form factor utility of the loadboard. In this way, the universal DUT adaptor testing systems and methods allows different form factor DUTs to be used with an embedded generic loadboard within the chamber assembly thereby increasing the flexibility of the chamber and the associated tester with regard to the different types of DUTs that can be used.

Figure 2:
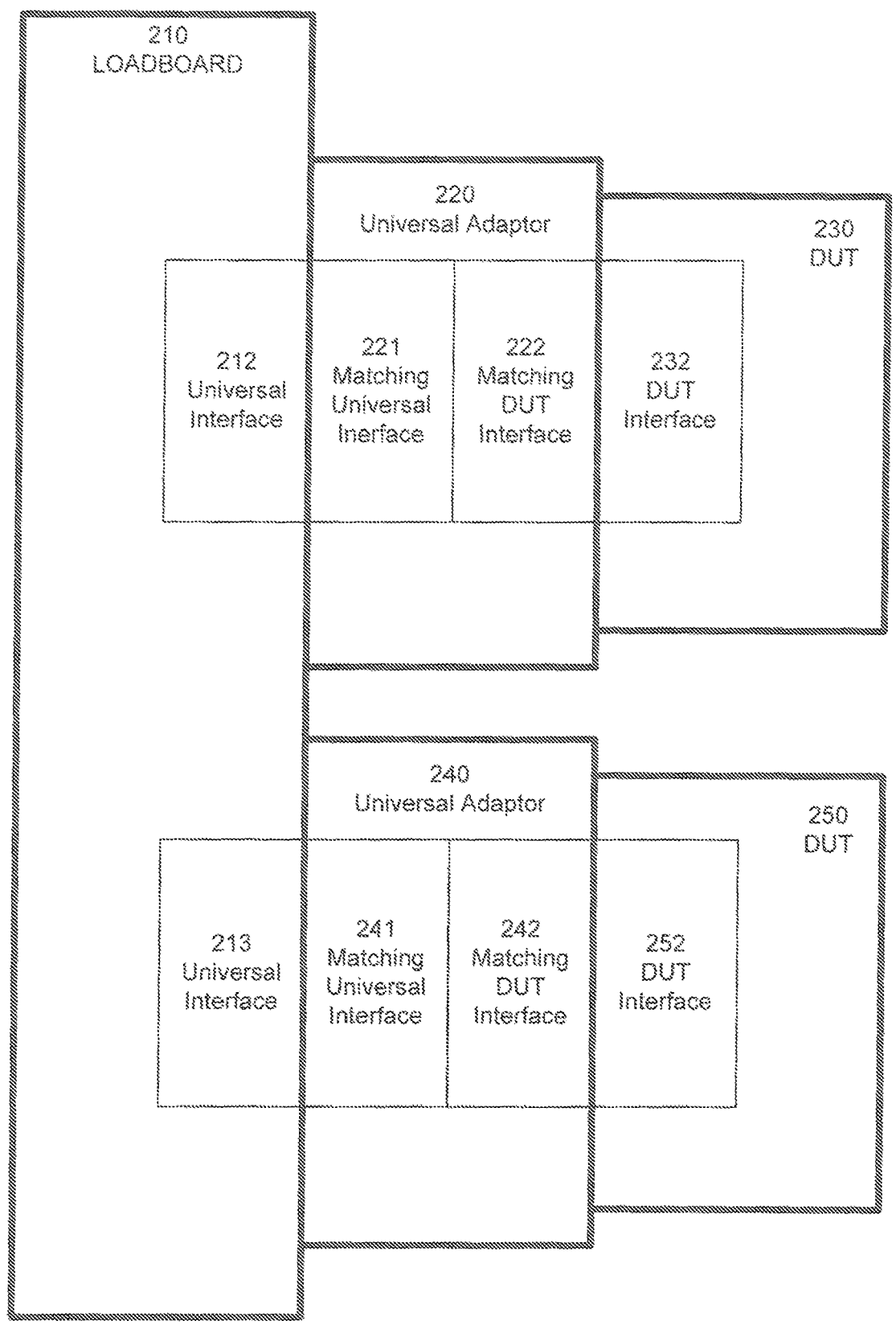
FIG. 2 is a block diagram of an exemplary universal adapter system in accordance with one embodiment.

FIG. 2 is a block diagram of an exemplary universal adapter system 200 in accordance with one embodiment. Universal adapter system 200 includes loadboard 210, universal adaptor 220, universal adaptor 240, device under test (DUT) 230, and DUT 250. Loadboard 210 includes universal interface 212 and 213. Universal adaptor 220 includes matching universal interface 221 and matching DUT interface 222. Universal adaptor 420 includes matching universal interface 241 and matching DUT interface 242. DUT 230 includes DUT interface 232 and DUT 250 includes DUT interface 252.

The components of exemplary universal adapter system 200 cooperatively operate to couple with one another. Universal interface 212 selectively (e.g., removably, replaceably, etc.) couples to matching universal interface 221 which is coupled to matching DUT interface 222. Matching DUT interface 222 selectively (e.g., removably, replaceably, etc.) couples to DUT interface 232. Universal interface 213 selectively (e.g., removably, replaceably, etc.) couples to matching universal interface 241 which is coupled to matching DUT interface 242. Matching DUT interface 242 selectively (e.g., removably, replaceably, etc.) couples to DUT interface 252.

Matching universal interfaces 222 and 242 match universal interfaces 212 and 213. In one embodiment, matching universal interfaces 221 and 241 are considered complementary coupling matches to universal interfaces 212 and 213. Matching universal interfaces 222 and 242 have the same coupling configuration. Universal interfaces 212 and 213 have the same coupling configuration.

Matching DUT interfaces 222 and 242 match DUT interfaces 232 and 252 respectively. In one embodiment, matching DUT interfaces 222 and 242 are considered complementary coupling matches to DUT interfaces 232 and 252. In one embodiment, matching DUT interfaces 222 and 242 have different coupling configurations. DUT interfaces 232 and 252 can have different coupling configurations. In one embodiment, matching DUT interfaces 222 and 242 can have the same coupling configurations. Similarly, DUT interfaces 232 and 252 can have the same coupling configurations.

Figure 3:
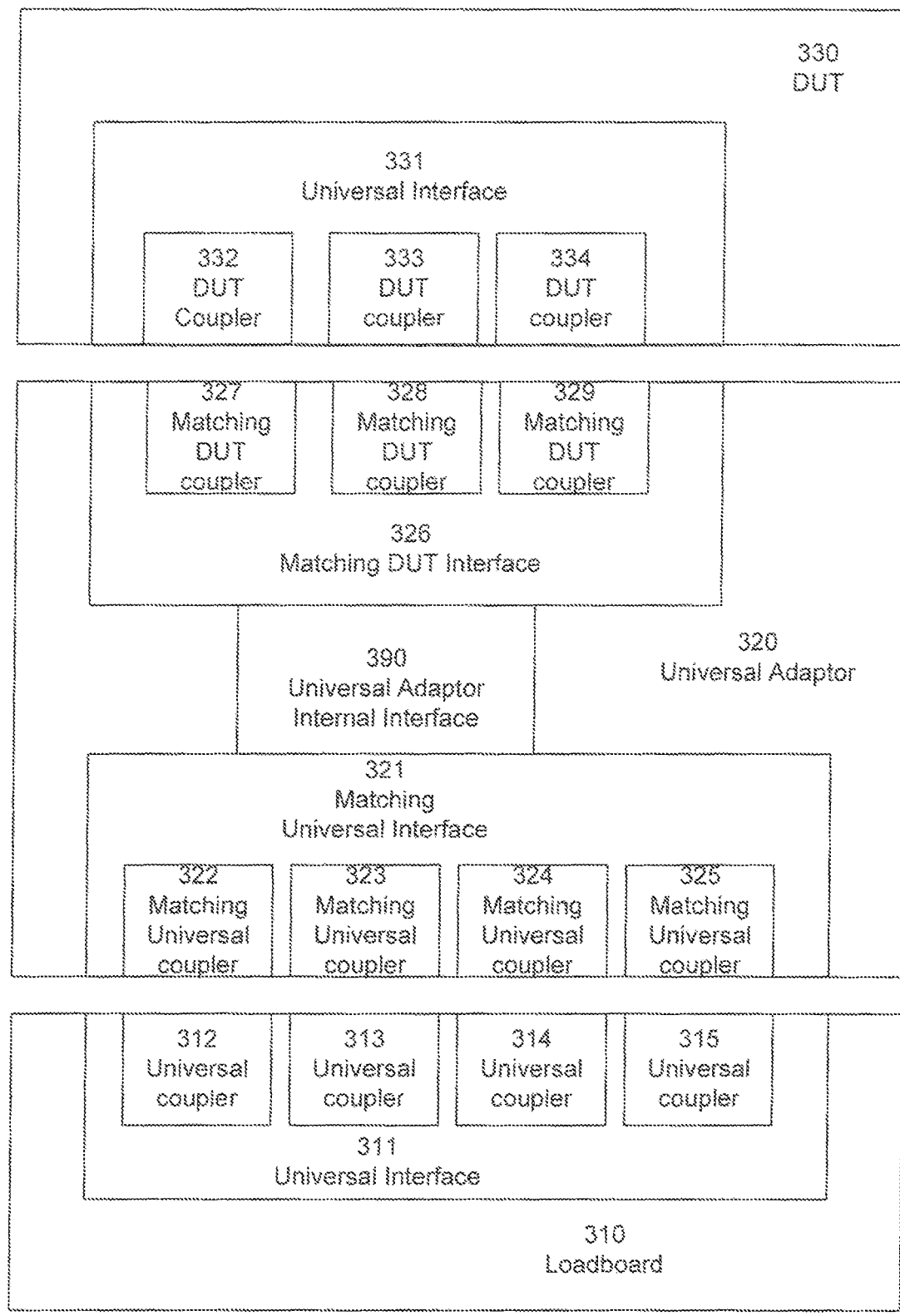
FIG. 3 is a block diagram of an exemplary universal adapter system in accordance with one embodiment.

FIG. 3 is a block diagram of an exemplary universal adapter system 300 in accordance with one embodiment. Universal adapter system 300 includes loadboard 310, universal adapter 320, and DUT 320. Loadboard 310 includes universal interface 311 which includes universal couplers 313, 313, 314, and 315. Universal adapter 320 includes matching universal interface 321 which includes matching universal couplers 323, 323, and 335. Universal adapter 320 includes matching DUT interface 326 which includes matching DUT couplers 327, 328, and 329. DUT 320 includes universal DUT interface 331 DUT couplers 332, 333, and 334.

The components of exemplary universal adapter system 300 cooperatively operate to couple with one another. Universal interface 311 selectively (e.g., removably, replaceably, etc.) couples to matching universal interface 321 which is coupled to matching DUT interface 326, which selectively couples to matching DUT interface 331. Universal couplers 313, 313, 314, and 315 selectively couple to matching universal couplers 323, 323, 324, and 335, respectively. Matching universal couplers 323, 323, 324, and 335 are coupled to universal adaptor internal interface 390 which is coupled to matching DUT couplers 327, 328, and 329. In one embodiment, universal adaptor internal interface 390 is configured to coordinate the transition of signal communication between matching universal couplers (e.g., 323, 323, 324, 335, etc.) and matching DUT couplers (e.g., 327, 328, 329, etc.). Matching DUT couplers 327, 328, and 329 are selectively coupled to DUT couplers 332, 333, and 334.

It is appreciated there can be various types of universal couplers (e.g., co-axial, molex coupler, Japan Solderless Terminal (JST) wire to board connector, rejistered jack (RJ), international electrotechnical commission (IEC) connector, pin header, etc.). The universal couplers 313, 313, 314, and 315 can be different types of couplers in a universal interface or same type of couplers. In one embodiment, even though there can be various types of universal couplers in an individual universal interface, the plurality of universal interfaces on a loadboard have the same configuration. It is appreciated there can be various types of DUT couplers (e.g., co-axial, molex, pin header, pogo, serial advanced technology attachment (SATA), and universal serial bus (USB), peripheral component interconnect express (PCIe), Non Volatile Memory Express (NVMe), U.2, M.2, etc.). The DUT couplers 327, 328, and 329 can be the same or different types of couplers. In one embodiment, a coupler can be a first type of complementary coupler (e.g., plug, pin, prong, etc.) and a matching coupler can be a second type of complementary coupler (e.g., receptacle, socket, slot, etc.), of vice versa.

Figure 4:
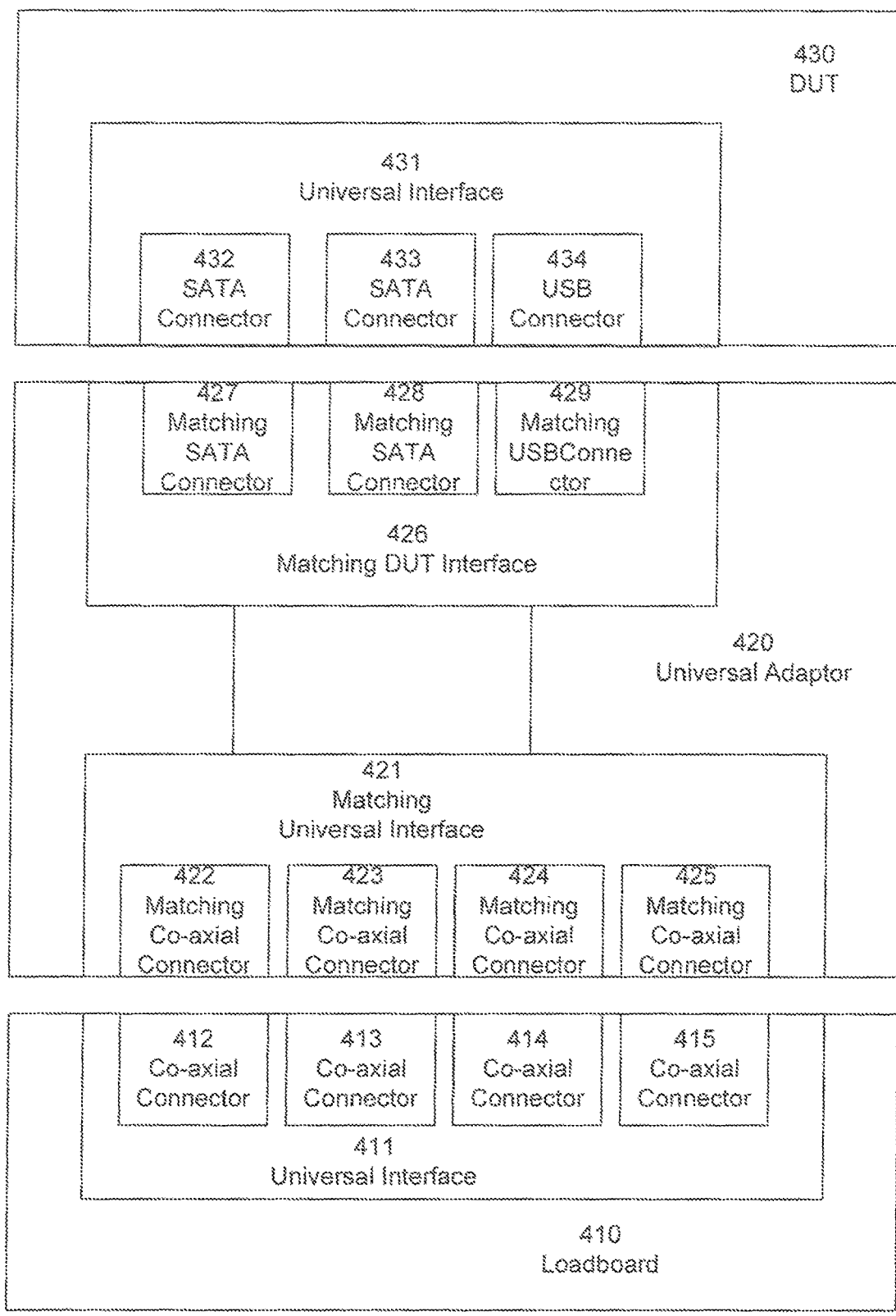
FIG. 4 is a block diagram of one implementation of an exemplary universal adapter system in accordance with one embodiment.

FIG. 4 is a block diagram of an exemplary universal adapter system 400 in accordance with one embodiment. In one exemplary implementation, the DUT couplers/connectors include different types of couplers/connectors (e.g., SATA, USB, etc.). In one embodiment, universal adapter system 400 is similar to universal adapter system 300 in which the universal couplers are co-axial connectors and the DUT couplers include SATA connectors and a USB connector. Universal adapter system 400 includes loadboard 410, universal adapter 420, and DUT 420. Loadboard 410 includes universal interface 411 which includes co-axial connectors 413, 413, 414, and 415. Universal adapter 420 includes matching universal interface 421 which includes matching co-axial connectors 422, 423, 424, and 435. Universal adapter 420 includes matching DUT interface 426 which includes matching SATA connectors 427 and 428, and matching USB connector 429. DUT 420 includes DUT interface 431 which includes SATA connectors 432 and 433, and USB connector 434. Universal interface 411 selectively (e.g., removably, replaceably, etc.) couples to matching universal interface 421 which is coupled to matching DUT interface 326, which selectively couples to matching DUT interface 431.

Figure 5:
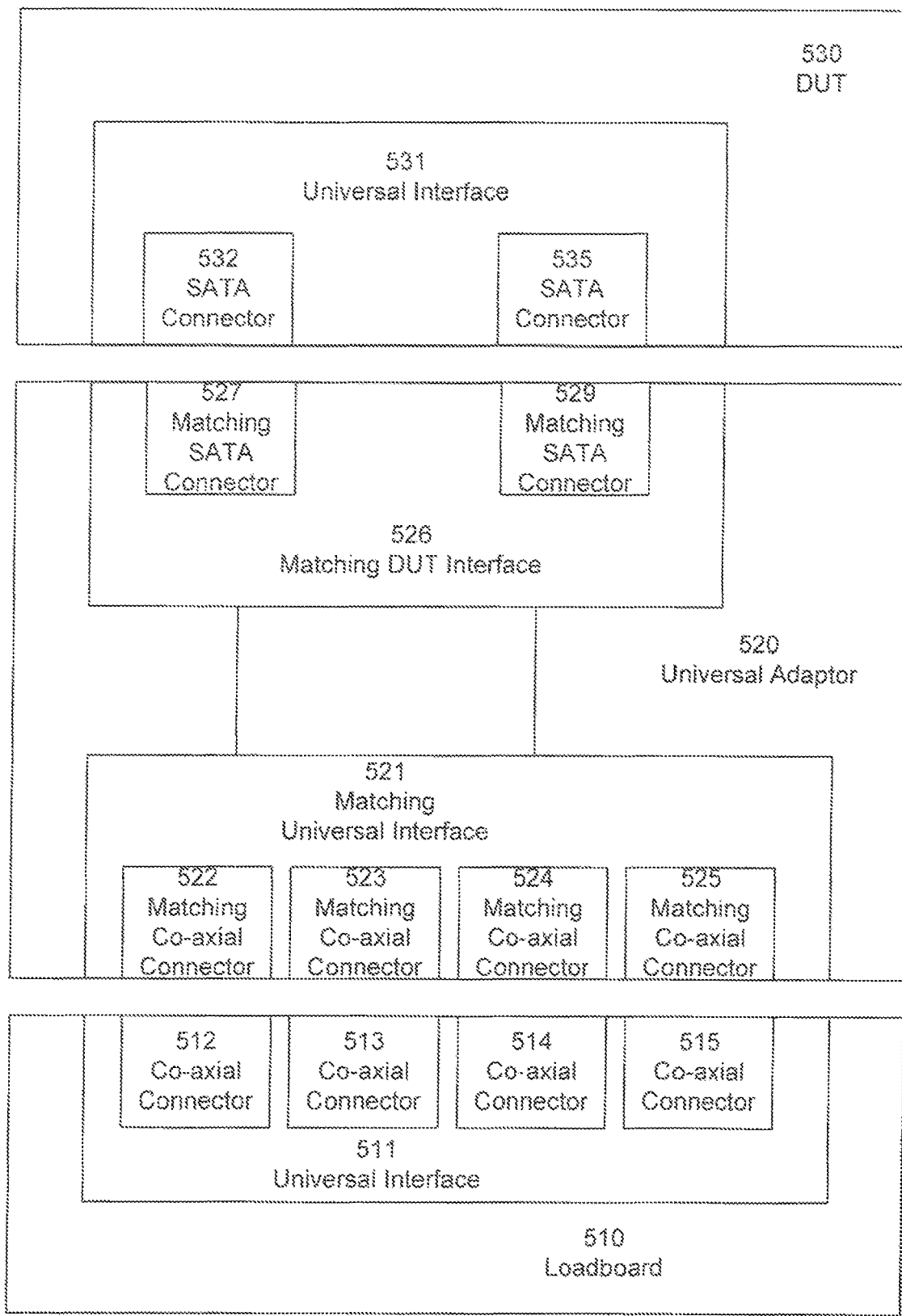
FIG. 5 is a block diagram of another implementation of an exemplary universal adapter system in accordance with one embodiment.

FIG. 5 is a block diagram of an exemplary universal adapter system 500 in accordance with one embodiment. In one exemplary implementation, the DUT couplers/connectors include the same types of couplers/connectors (e.g., SATA, USB, etc.). In one embodiment, universal adapter system 500 is similar to universal adapter system 300 in which the universal couplers are co-axial connectors and the DUT couplers include SATA connectors. Universal adapter system 500 includes loadboard 510, universal adapter 520, and DUT 520. Loadboard 510 includes universal interface 511 which includes co-axial connectors 512, 513, 514, and 515. Universal adapter 520 includes matching universal interface 521 which includes matching co-axial connectors 522, 523, 524, and 535. Universal adapter 520 includes matching DUT interface 526 which includes matching SATA connectors 527 and 529. DUT 520 includes DUT interface 531 which includes SATA connectors 532 and 535. Universal interface 511 selectively (e.g., removably, replaceably, etc.) couples to matching universal interface 521 which is coupled to matching DUT interface 526, which selectively couples to matching DUT interface 531.

Figure 6:
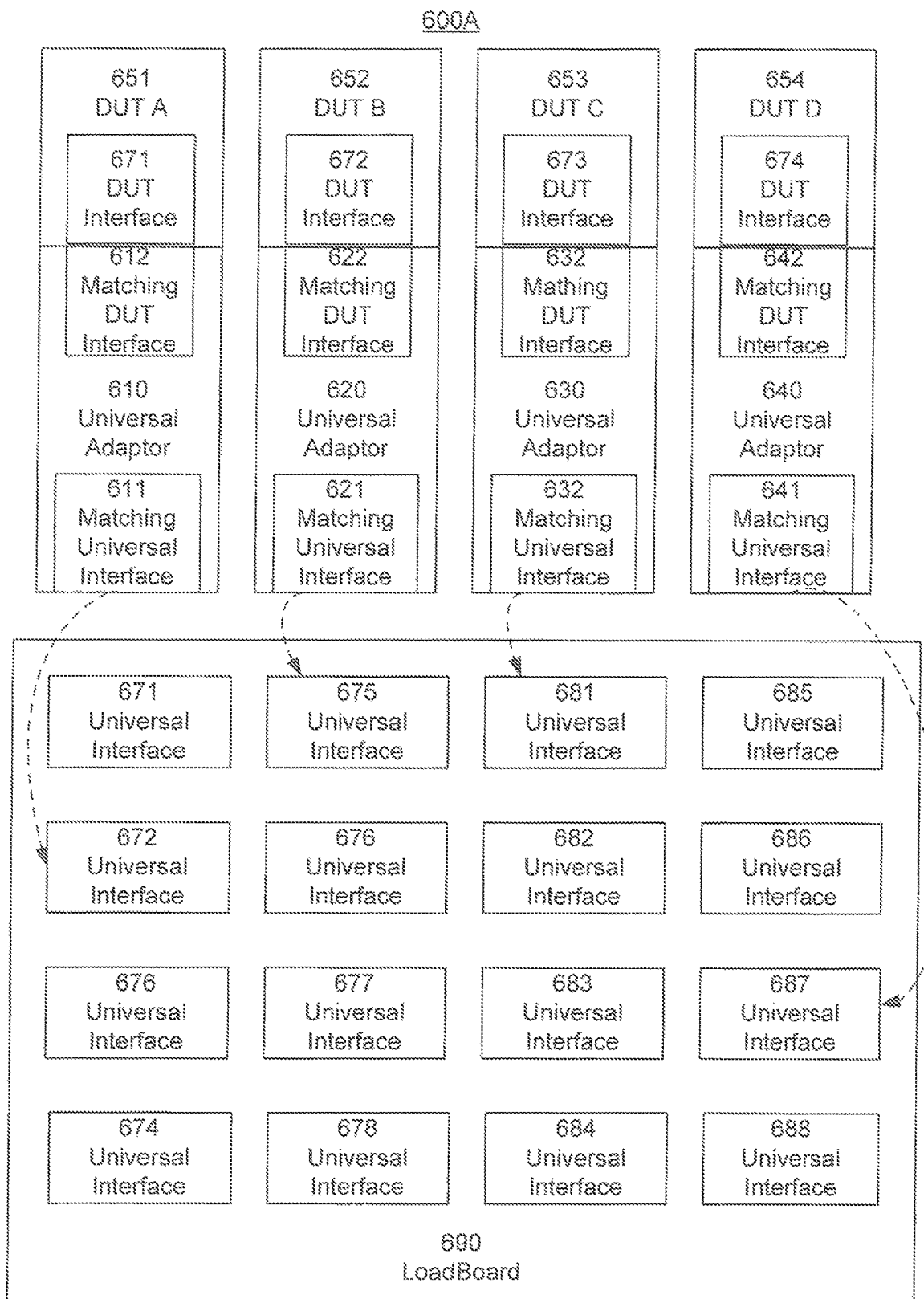
FIG. 6 is a block diagram of an exemplary universal adapter system at a first time in accordance with one embodiment.

FIG. 6 is a block diagram of an exemplary universal adapter system 600A in accordance with one embodiment. Universal adapter system 600 includes loadboard 690, universal adapters 610, 620, 630, and 640, and DUTs 651, 652, 653, and 654. Loadboard 690 includes universal interfaces 671, 672, 673, 674, 675, 676, 678, 681, 682, 683, 684, 685, 686, and 688, which have the same coupling configurations. Universal interfaces 671, 672, 673, 674, 675, 676, 678, 681, 682, 683, 684, 685, 686, and 688 have the same coupling configuration. Universal adapters 610, 620, 630, and 640 include matching universal interfaces 611, 621, 631, and 641, and matching DUT interfaces 612, 622, 632, 634, respectively. DUTs 651, 652, 653, and 654 include DUT interfaces 671, 672, 673, and 674, respectively. DUT interfaces 671, 672, 673, and 674 can have different coupling configurations. In one embodiment, DUTs 651, 652, 653, and 654 selectively couple to loadboard 690 via universal adaptors 610, 620, 630, and 640, respectively. In one exemplary implementation, matching universal interfaces 611, 621, 631, and 641 selectively couple to universal interfaces 672, 675, 681, and 687, respectively. In one embodiment, exemplary universal adapter system 600A is the configuration of universal adapter system 600 at a first time.

Figure 7:
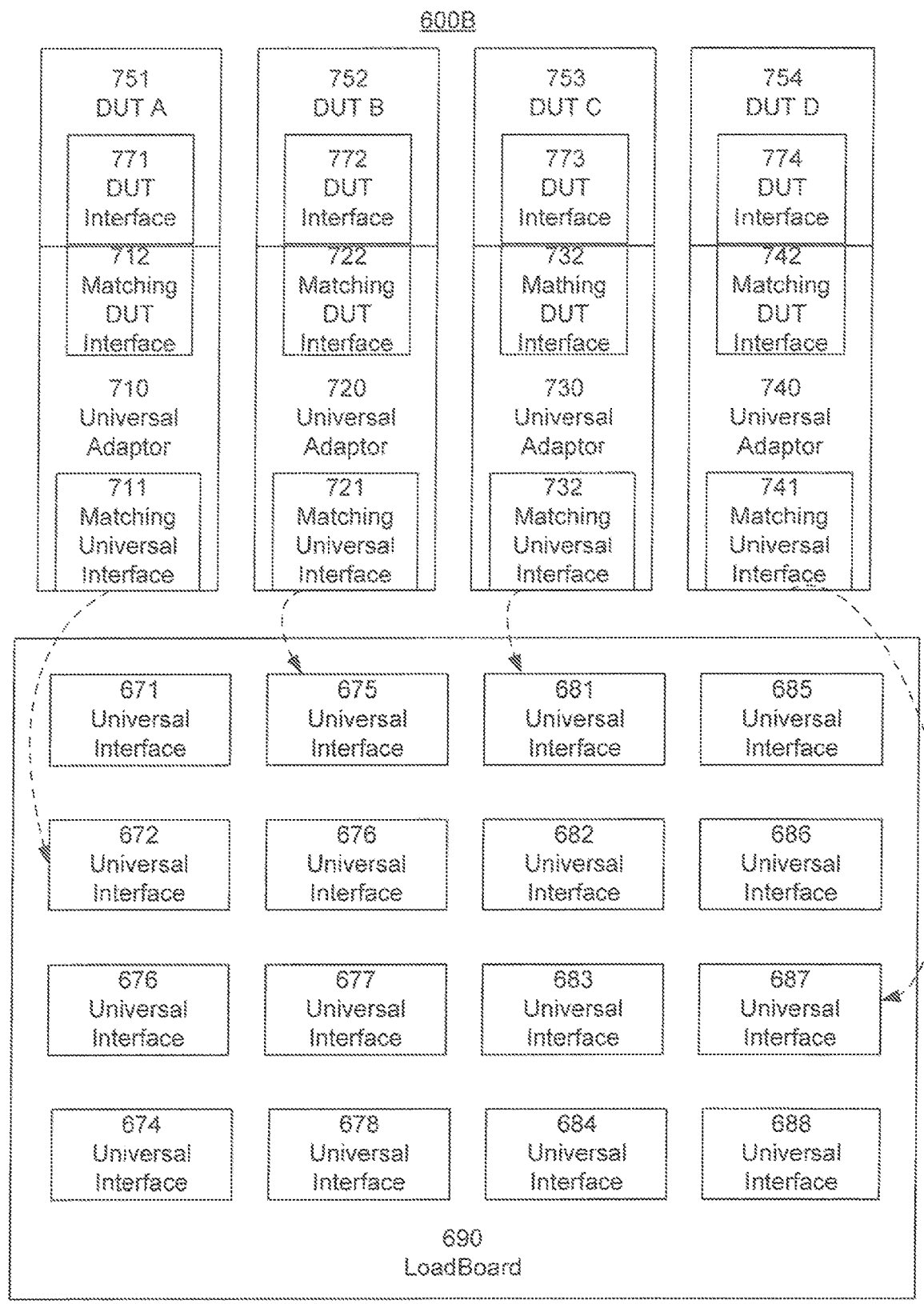
FIG. 7 is a block diagram of an exemplary universal adapter system at a second time in accordance with one embodiment.

FIG. 7 is a block diagram of an exemplary universal adapter system 600B in accordance with one embodiment. In one embodiment, exemplary universal adapter system 600B is the configuration of universal adapter system 600 at a second time. In one exemplary implementation, at the second time the DUTs 651, 652, 653, and 654 have been removed and replaced with DUTs 751, 752, 753, and 754. Universal adapter system 60B includes loadboard 690, universal adapters 710, 720, 730, and 740, and DUTs 751, 752, 753, and 754. Loadboard 690 includes universal interfaces 671, 672, 673, 674, 675, 676, 678, 681, 682, 683, 684, 685, 686, and 688, which have the same coupling configurations. Universal interfaces 671, 672, 673, 674, 675, 676, 678, 681, 682, 683, 684, 685, 686, and 688 have the same coupling configuration. Universal adapters 710, 720, 730, and 740 include matching universal interfaces 711, 721, 731, and 741, and matching DUT interfaces 712, 722, 732, 734, respectively. DUTs 751, 752, 753, and 754 include and DUT interfaces 771, 772, 773, and 774, respectively. The DUTs 751, 752, 753, and 754 can be the same or different than DUTs 651, 652, 653, and 654. The DUTs 751, 752, 753, and 754 can be the same or different than one another.

In one embodiment, the DUTs 751 and 752 are different than one another and also different than DUTs 651 and 652, while the DUTS 753 and 754 are the same as one another and the same as DUTs 653 and 654. DUT interfaces 771 and 772 have different coupling configurations than one another. DUT interfaces 771 and 772 have different coupling configurations than DUT interfaces 671 and 672. DUT interfaces 773 and 774 have the same coupling configurations as one another and DUT interfaces 673 and 674. Universal adapters 710 and 720 are different than one another and universal adapters 730 and 740 are the same as one another. Universal adapters 710 and 720 are different than universal adapters 610 and 620, and universal adapters 730 and 740 are the same as universal adapters 630 and 640. Matching DUT interfaces 712 and 722 are different than one another and different than matching DUT interfaces 612 and 622. Matching DUT interfaces 732 and 742 are same as one another and same as matching DUT interfaces 632 and 642. The matching universal interfaces 711, 721, 731, and 741 are the same as one another and the same as matching universal interfaces 611, 621, 631, and 641. Thus, DUTs 751, 752, 753 and 754 can be selectively coupled to universal interfaces 672, 675, 681, and 687 of loadboard 690 (e.g., via universal adapters 710, 720, 730, and 740), similar to the way just like DUTs 651, 652, 653 and 654 were selectively coupled to universal interfaces 672, 675, 681, and 687 of loadboard 690 (e.g., via universal adapters 610, 620, 630, and 640), even though DUTs 751 and 752 have different coupling form factor configurations than DUTs 651 and 652.

FIG. 8 is a flow chart of an exemplary method 800 in accordance with one embodiment.

In block 801, a plurality of DUT's are coupled to a respective plurality of universal adapters. In one embodiment, one of the plurality of DUT's is configured with a different coupling form factor than another one of the plurality of DUT's. In one exemplary implementation, the plurality of DUT's are removable from the respective plurality of universal adapters. In one embodiment, one of the plurality of DUT's is a first type of device and another one of the plurality of DUT's is a second type of device. A DUT interface in one of the plurality of DUTs can be different than another DUT interface in another one of the plurality DUTs.

In block 802, the plurality of universal adapters are coupled to a respective plurality of universal interfaces included in a test loadboard. In one embodiment, the plurality of universal interfaces have the same coupling form factor. In one exemplary implementation, and plurality of universal adapters are removable from the respective plurality of universal interfaces. The plurality of DUTs can be coupled to test equipment that includes the loadboard without changing out the test loadboard.

In block 803, the DUTs are tested.

In one embodiment, systems and methods include efficient and effective universal interfaces enabling load board utilization with different devices. There can be one generic or base load board with various mechanical adaptors to fit or allow customers to test devices with different form factors. Different form factor DUTS can be loaded into a chamber without changing out load boards.

Figure 9:
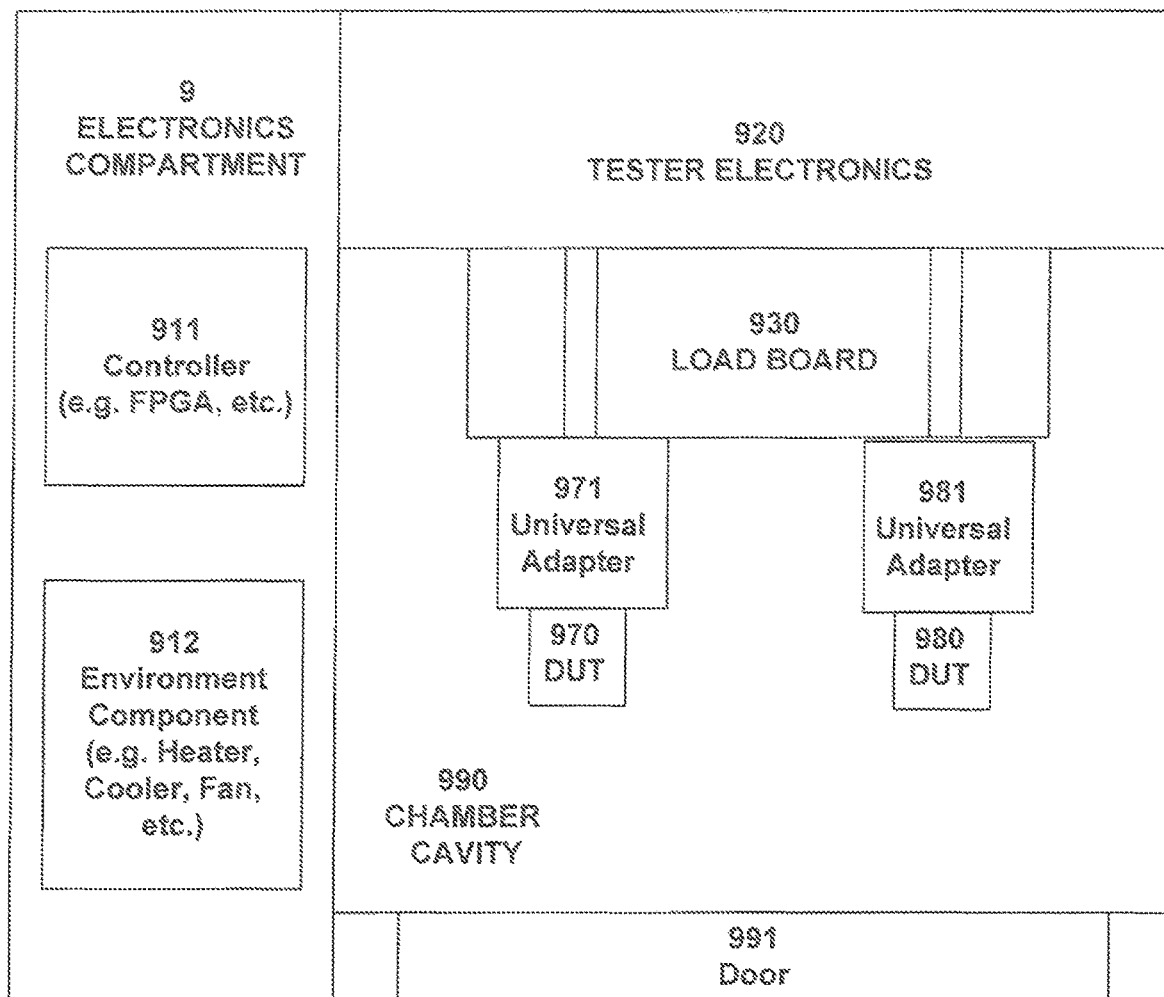
FIG. 9 is a block diagram of an exemplary testing system in accordance with one embodiment.
Figure 10:
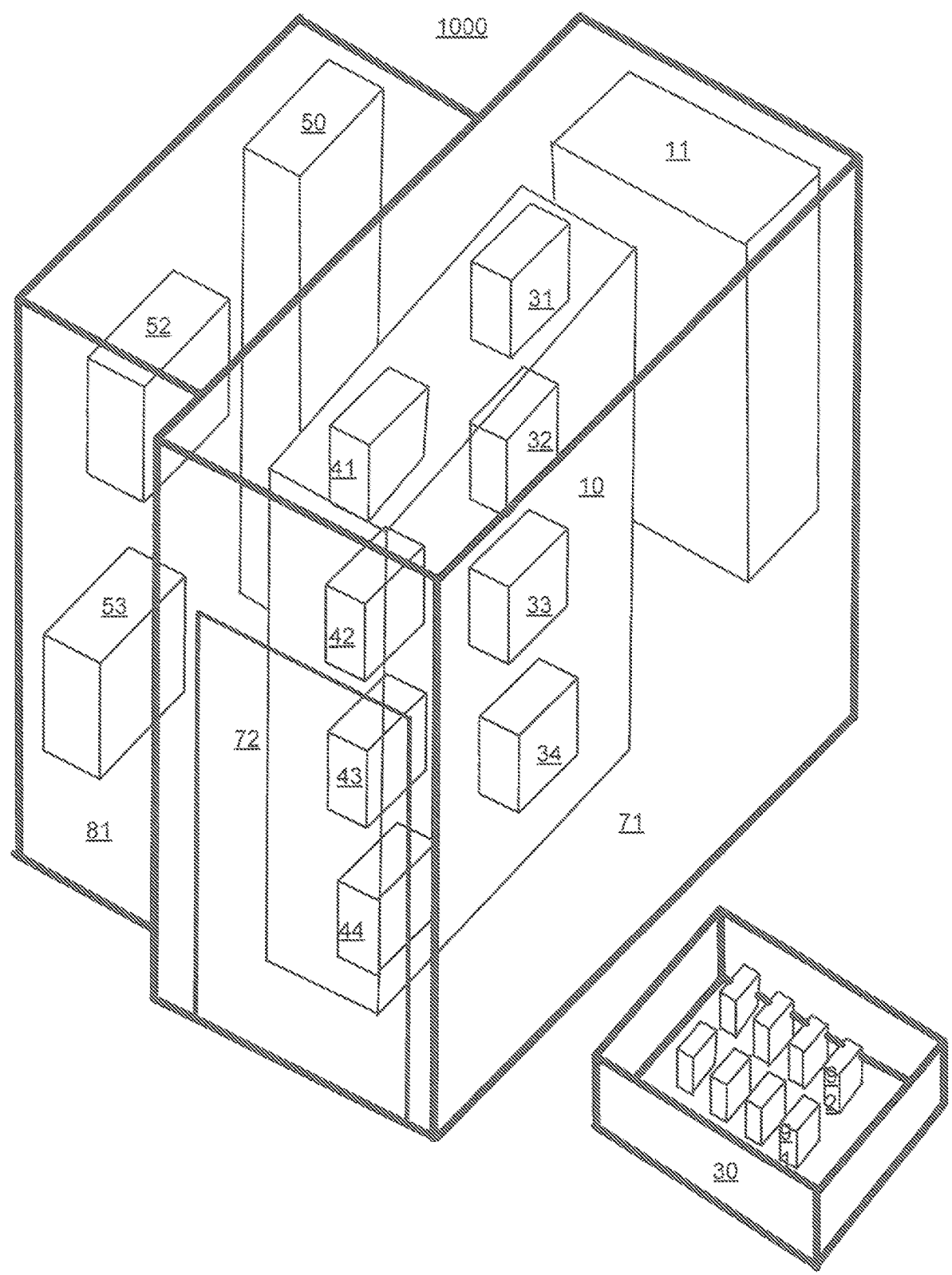
FIG. 10 is a block diagram of another exemplary testing system in accordance with one embodiment.
Figure 11:
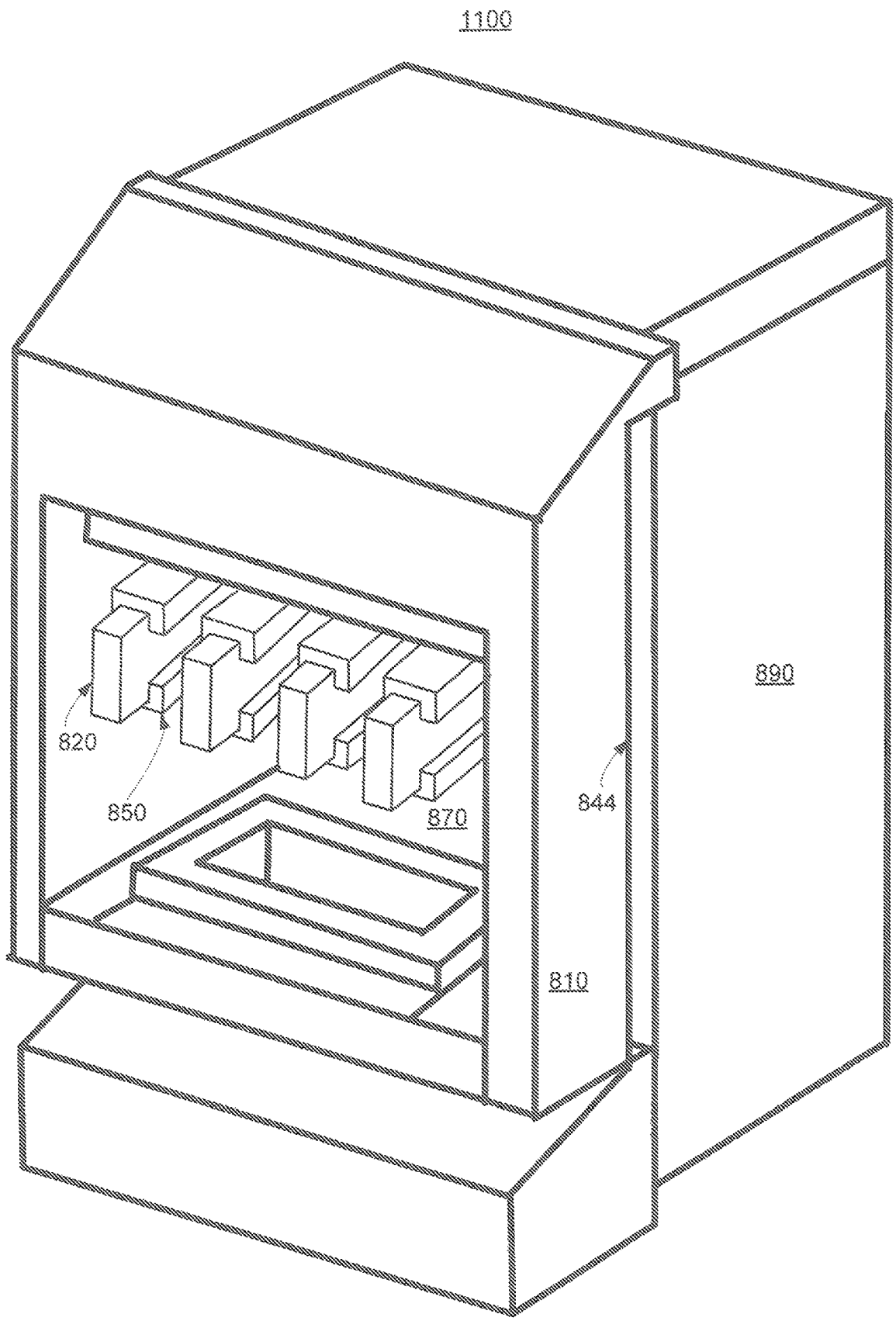
FIG. 11 is a block diagram of an exemplary test system in accordance with one embodiment.

In one embodiment, universal adapter systems and methods can be implemented in test systems similar to the embodiments shown in the FIGS. 9, 10, and 11.

FIG. 9 is a block diagram of an exemplary testing system 900 in accordance with one embodiment. Testing system 900 includes electronics compartment 910 and tester electronics 920, load board 930, universal adapters 971 and 981, and DUTs 970 and 980, and testing chamber 990 with door 991. Electronics compartment 910 includes controller 911 and environment compartment 912.

It is appreciated that selectable testing systems and methods can be implemented in various testing system configurations or approaches. FIG. 10 is a block diagram of an exemplary testing system 1000 in accordance with one embodiment. It consists of a large controlled environmental chamber or oven 71 that contains an oven rack 10 and heating and cooling elements 11. The oven rack 10 contains devices under test (DUTs) in a number of load board trays 31, 32, 33, 34, 41, 42, 43, and 44. The environmental test chamber 71 has solid walls and a solid door 72 that enclose the test rack 10. The heating and cooling elements 11 can have a wide temperature range (e.g., −10 to 120 degrees C.). The tester or test head 81 contains various racked components, including system controller network switches 52, system power supply components 53, and tester slices 50 (the tester slice contains the tester electronics). The load board trays (e.g., 30, 31, etc.) are connected to tester slices 50 (multiple load board trays can be coupled to a single tester slice). There is also a block diagram of a tester tray 30 and devices under test (e.g., 91, 92, etc.). The load board trays are manually populated with devices under test. The full tester trays (e.g., 30, 31, etc.) are manually inserted into environmental chamber 71 and manually connected to the tester electronics (e.g., 50, 52, 53, etc.). This process can be labor intensive and cumbersome (e.g., the process requires opening the door 72 of the environmental chamber 71 and manually trying to insert the trays though the door 72 into the appropriate location).

In one embodiment, a test system includes device interface board and tester electronics that control testing operations. The tester electronics can be located in an enclosure which together are referred to as the primitive. The device interface board has a device under test access interface that allows physical manipulation of the devices under test (e.g., manual manipulation, robotic manipulation, etc.). A device under test can be independently manipulated physically with little or no interference or impacts on testing operations of another device under test. Device interface boards and their load boards can be conveniently setup to accommodate different device form factors. In one embodiment, load boards are configured with device under test interfaces and universal primitive interfaces. In one exemplary implementation, the device interface board can control an ambient environment of a device under test.

FIG. 11 is a block diagram of an exemplary test system 1100 in accordance with one embodiment. Test system 1100 includes a testing primitive 890 (e.g., containing the testing control hardware and power supply components for the devices under test, etc.) and a device interface board (DIB) 810 disposed in front of and coupled to the primitive 890. In one embodiment, the device interface board 810 is a partial enclosure. The load board is also coupled to and electrically interfaces with the primitive 890 to obtain power and high-speed electrical signals for testing the device under test 820. The device interface board can include air flow channels 844 that allow air flow to and from the device under test environment. The air flow channels 844 can include baffles.

The device interface board 810 partial enclosure includes a device under test access interface 870 that enables easy physical access (e.g., unobstructed, unimpeded, etc.) to the devices under test. In one embodiment, universal adapters 850 enable different types of DUTs to be easily loaded on/coupled to a universal loadboard. Environmental control components (not shown) control and maintain device under test ambient environmental conditions (e.g., temperature, air flow rate, etc.). The environmental control components can create an environmental envelope that prevents or mitigate interference from outside environmental conditions on the operations of devices under test. While access to test system 800 may be easier than test system 700, test system universal adapters enable both supplemental operations and functional testing that still offers benefits associated with not requiring the expensive and time-consuming changing of loadboards and multiple moves of DUTs between separate test systems (unlike conventional test approaches).

While the invention has been described in conjunction with the preferred embodiments, it will be understood that they are not intended to limit the invention to these embodiments. On the contrary, the invention is intended to cover alternatives, modifications, and equivalents. The description is not intended to be exhaustive or to limit the invention to the precise forms disclosed, and obviously many modifications and variations are possible.

Thus, universal adapter systems and methods can allow DUTs with different coupling interfaces to be efficiently and effectively tested. In one embodiment, a greater number of devices can be tested at least in part concurrently or in parallel as compared to conventional approaches, thereby increasing throughput. The universal adapter systems and methods can compress overall test time which facilitates cost reductions. They can also allow test conditions to more closely approximate actual conditions (e.g., large data center conditions, etc.).

Some portions of the detailed descriptions are presented in terms of procedures, logic blocks, processing, and other symbolic representations of operations on data bits within a computer memory. These descriptions and representations are the means generally used by those skilled in data processing arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are associated with the appropriate physical quantities and are merely convenient labels applied to these quantities. Unless specifically stated otherwise as apparent from the discussions, it is appreciated that throughout the present application, discussions utilizing terms such as "processing", "computing", "calculating", "determining", "displaying" or the like, refer to the action and processes of a computer system, or similar processing device (e.g., an electrical, optical, or quantum, computing device), that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components.

It is appreciated that embodiments of the present invention can be compatible and implemented with a variety of different types of tangible memory or storage (e.g., RAM, DRAM, flash, hard drive, CD, DVD, etc.). The memory or storage, while able to be changed or rewritten, can be considered a non-transitory storage medium. By indicating a non-transitory storage medium, it is not intended to limit characteristics of the medium, and can include a variety of storage mediums (e.g., programmable, erasable, nonprogrammable, read/write, read only, etc.) and "non-transitory" computer-readable media comprises all computer-readable media, with the sole exception being a transitory, propagating signal.

It is appreciated that the description includes exemplary concepts or embodiments associated with the novel approach. It is also appreciated that the listing is not exhaustive and does not necessarily include all possible implementation. The concepts and embodiments can be implemented in hardware, firmware, software, and so on. In one embodiment, the methods or process describe operations performed by various processing components or units. In one exemplary implementation, instructions, or directions associated with the methods, processes, operations etc. can be stored in a memory and cause a processor to implement the operations, functions, actions, etc.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents. The listing of steps within method claims do not imply any particular order to performing the steps, unless explicitly stated in the claim.

The invention claimed is:

1. A testing system comprising:
   a loadboard comprising a plurality of universal interfaces with a same coupling configuration;
   a plurality of devices under test (DUTs) comprising a plurality of DUT interfaces respectively, wherein a first one of the plurality of DUTs is different than a second one of the plurality of DUTs, wherein the first one of the plurality of DUTs has a first type of DUT interface and the second one of the plurality of DUTs has a second type of DUT interface, wherein the first type of DUT interface has a different coupling configuration compared to the second type of DUT interface; and
   a plurality of universal adapters comprising
      a plurality of matching universal interfaces that match the plurality of universal interfaces in the loadboard respectively, and
      a plurality of matching DUT interfaces, wherein a first one of the plurality of universal adapters comprises a first one of the plurality of matching DUT interfaces that matches the first type of DUT interface and a second one of the plurality of universal adapters comprises a second one of the plurality of matching DUT interfaces that matches the second type of DUT interface, wherein the first one of the plurality of matching DUT interfaces has a different coupling configuration compared to the second one of the plurality of matching DUT interfaces, wherein the plurality of universal adapters are selectively coupled to the loadboard and the plurality of universal adapters are respectively coupled to the plurality of DUTs on an individual basis, wherein one of the plurality of universal adapters has a single interface for coupling with a single one of the plurality of DUTs at a time.

2. The testing system of claim 1, wherein one of the plurality of matching universal interfaces comprises multiple matching universal couplers that respectively match universal couplers included in one of the plurality of universal interfaces.

3. The testing system of claim 1, wherein one of the plurality of matching DUT interfaces comprises multiple matching DUT couplers that respectively match DUT couplers included in one of the plurality of DUT interfaces.

4. The testing system of claim 1, wherein a first DUT coupler included in a first one of the plurality of DUT interfaces is different than a second DUT coupler included in a second one of the plurality of DUT interfaces.

5. The testing system of claim 1, wherein a connector in a first one of the plurality of universal interfaces is the same type of connector as a respective connector that is in another one of the plurality of universal interfaces.

6. The testing system of claim 1, wherein a connector in a first one of the plurality of DUT interfaces is a different type of connector than a respective connector that is in a second one of the plurality of DUT interfaces.

7. The testing system of claim 1, wherein one of the plurality of universal interfaces comprises a co-axial connector.

8. The testing system of claim 1, wherein one of the plurality of DUT interfaces comprises a serial advanced technology attachment (SATA) connector.

9. The testing system of claim 1, wherein one of the plurality of DUT interfaces comprises a nonvolatile memory express (NVMe) connector.

10. A universal adapter method comprising:
coupling a plurality of devices under test (DUTs) to a plurality of universal adapters respectively, wherein one of the plurality of DUTs is different than another one of the plurality of DUTs and the one of the plurality of DUTs has a type of DUT interface that has a different coupling form factor than another type of DUT interface of the another one of the plurality of DUTs, wherein one of the plurality of universal adapters has a single interface for coupling with a single one of the plurality of DUTs at a time;
coupling the plurality of universal adapters to a respective plurality of universal interfaces included in a test loadboard, wherein the respective plurality of universal interfaces have a same coupling form factor; and
testing the plurality of DUTs.

11. The universal adapter method of claim 10, wherein respective ones of the plurality of DUTs are removable from respective ones of the plurality of universal adapters, and respective ones of the plurality of universal adapters are removable from respective ones of the respective plurality of universal interfaces.

12. The universal adapter method of claim 10, wherein one of the plurality of DUTs is a first type of device and another one of the plurality of DUTs is a second type of device.

13. The universal adapter method of claim 10, wherein the plurality of DUTs are coupled to test equipment that comprises the test loadboard without changing out the test loadboard.

14. The universal adapter method of claim 10, wherein a DUT interface in one of the plurality of DUTs is different than another DUT interface in another one of the plurality of DUTs.

15. A universal adapter comprising:
a matching device under test (DUT) interface configured to selectively couple with a single DUT at a time;
a matching universal interface configured to selectively couple with a universal interface included in a loadboard, wherein the matching universal interface is configured to selectively couple with the universal interface included in the loadboard regardless of differences in protocols and differences in coupling interface configurations of the single DUT and another DUT configured to selectively couple with the universal interface included in the loadboard; and
a universal adaptor internal interface coupled to the matching universal interface and the matching device under test (DUT) interface, wherein the universal adaptor internal interface is configured to coordinate a transition of signal communication between the matching universal interface and the matching DUT interface.

16. The universal adapter of claim 15, wherein the matching universal interface comprises a matching universal coupler that matches a universal coupler included in the loadboard.

17. The universal adapter of claim 15, wherein the matching DUT interface comprises a matching DUT coupler that matches a DUT coupler included in the single DUT.

18. The universal adapter of claim 17, wherein the matching DUT coupler is different than another matching DUT coupler included in another universal adapter.

19. The universal adapter of claim 15, wherein the universal interface comprises a co-axial connector.

20. The universal adapter of claim 15, wherein the matching DUT interface comprises a serial advanced technology attachment (SATA) connector.

* * * * *